(12) United States Patent
McGowan (10) Patent No.: US 6,825,716 B2
(45) Date of Patent: Nov. 30, 2004

(54) SYSTEM AND APPARATUS FOR REDUCING OFFSET VOLTAGES IN FOLDING AMPLIFIERS

(75) Inventor: Michael J. McGowan, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/135,645

(22) Filed: Apr. 30, 2002

(65) Prior Publication Data

US 2003/0201823 A1 Oct. 30, 2003

(51) Int. Cl.[7] ................................................. H03F 1/02
(52) U.S. Cl. ........................ 330/9; 330/69; 327/124
(58) Field of Search .............................. 330/9, 69, 52, 330/53; 327/124, 307

(56) References Cited

U.S. PATENT DOCUMENTS 3,688,209 A * 8/1972 Winkel ..................... 330/30 D
4,423,385 A * 12/1983 Evans ............................ 330/9
5,196,733 A * 3/1993 Shin ........................... 327/379
6,466,093 B1 * 10/2002 Yan ............................ 330/253

OTHER PUBLICATIONS

Pieter Vorenkamp, "A 12–b, 60–MSample/s Cascaded Folding and Interpolating ADC," IEEE Journal of Solid–State Circuits, vol. 32, No. 12, pp. 1876–1886, Dec. 1997.
Norbert R. Malik, *Electronic Circuits Analysis, Simulation, and Design*, Prentice–Hall, Inc., New Jersey, p. 564, 1995.

* cited by examiner

*Primary Examiner*—Henry Choe
(74) *Attorney, Agent, or Firm*—Toler, Larson & Abel, LLP (57) ABSTRACT

A system and apparatus for reducing offset voltages in folding amplifiers is disclosed. In one form, a folding amplifier for use in an analog-to-digital converter is provided. The folding amplifier includes a first current source operable to be coupled to a first differential pair and a second differential pair. The folding amplifier further includes a switching network coupled between the first current source and the first and second differential pairs and operable to enable coupling the first current source to at least one of the first differential pair and the second differential pair.

22 Claims, 7 Drawing Sheets

SYSTEM AND APPARATUS FOR REDUCING OFFSET VOLTAGES IN FOLDING AMPLIFIERS

FIELD OF THE DISCLOSURE

The disclosures herein relate generally to amplifiers and more particularly to a system and apparatus for reducing offset voltages in folding amplifiers.

BACKGROUND OF THE DISCLOSURE

Complications can arise when designing analog-to-digital converters (ADCs) with reduced device area, low power consumption, and simple process flows. For example, to achieve relative high bit conversions while meeting performance criteria, improvements in resolution and speed can be achieved using various techniques that frequently result in increased area, power consumption, and circuit complexity. For example, to increase resolution from an 8-Bit converter to a 12-Bit converter, device size of associated circuits and devices such as resistor and capacitor networks must be increased to improve the accuracy 16x, for example, +/−0.4% matching must be improved to +/−0.024%. Increasing device size is commonly used but is undesired due to increased die costs associated with the overall increase in device size of the ADC to achieve a resolution and accuracy.

Another approach commonly used to reduce circuit mismatch is auto-zeroing errors that can be inherent to a specific circuit design. For example, comparator mismatching and shifts with time and temperature can produce errors in differential threshold levels. An auto-zeroing technique can be used that includes providing a capacitor to capture the analog voltage against which the input analog signal is compared and null the offset errors of the comparator. For example, at the beginning of each A/D conversion, analog capacitors of the A/D converter are connected to detect errors in their differential threshold levels and zero the errors accordingly. This technique requires an auto-zero time period followed by the comparison of analog voltage levels loading to increased circuit complexity and fabrication processes (i.e. double poly process) for creating zeroing capacitor modules.

Another conventional solution for reducing mismatch errors includes calibrating or trimming the ADC to offset the error created due to device mismatch. As previously stated, one source of error in ADCs is the mismatch of resistive and capacitive networks used to provide the basic elements of analog accuracy in an ADC. Device mismatch can be overcome through auto-calibrating the ADC to offset errors and includes adding and/or removing components to offset errors. For example, during a manufacturing process, resistors and/or capacitors can be manufactured in the same batch process to produce precision matched trimming components. Adding and removing components can then be accomplished by to trim the offset error. For example, during an A/D converter linearity test, resistors and/or capacitors can be connected and disconnected in small delta values with a laser trim, fusible links, programmable ROM or other technique to offset mismatch error. This technique is limited due to requiring initial and subsequent calibration in addition to increased circuit complexity, and additional processing to provide trimming devices and/or components.

Another auto-calibration technique includes digitally calibrating the ADC to offset errors produced due to variances from device performance resulting in device mismatch. For example, an ADC can include a calibration cycle and automatic temperature trimming by a precision resistor and capacitor network. During trim, various combinations of digital values are tried and matched against other combinations of bits. Detected errors are cancelled by switching components in and out to remove the error. A similar technique commonly used includes storing correction-value digital numbers that are added to, or subtracted from, subsequent conversion results. This technique can lead to errors during operation of the ADC based on variances in operating temperatures and/or device degradation of components. As such, an initial and/or recurring set-up for testing/trimming the ADC to offset errors can be needed to maintain accurate calibration data.

Therefore, a system and/or device is needed that provides accurate high resolution A/D conversion while minimizing device size, maintaining moderate circuit complexity, and fabricated using a pure digital CMOS fabrication process with minimal processing steps.

DETAILED DESCRIPTION OF THE FIGURES

The disclosures made herein relate to reducing errors that occur due to device mismatch in analog-to-digital converters (ADCs). In one form, a folding amplifier operable for use in association with converting an analog input to a digital representation is disclosed. Folding amplifiers are known in the art and include having several pairs of differential amplifiers and associated input terminals (i.e. three pair for a three-fold amplifier, five pair for a five-fold amplifier, etc.). Folding amplifiers disclosed herein overcome errors that can be inherent to conventional folding amplifiers through providing a switching network coupled between the sample and hold and reference voltage portions of the ADC and a folding amplifier stage. The switching network alternates or switches the input signal from the input from the positive terminal of each folding amplifier to the negative terminal of each folding amplifier and vice versa. Switching occurs based on the rate of the sample and hold circuit such that during the hold period of the sample, each input signal is switched between each terminal corresponding to a differential pair within the folding amplifier thereby creating a chopping effect realized at the input of each differential pair. In one embodiment, if the frequency of the input signal is relatively low, a sample and hold may not be needed to acquire and input.

According to a further aspect of the invention, an ADC having a switching network at the folding amplifier inputs and an averaging resistive network coupled to the output of the folding amplifier is disclosed. The averaging resistive network includes one or more resistors coupled between the output of the folding amplifier and the input of the portion of the ADC. For example, the next stage can include conversion circuitry such as a flash comparator module or other circuitry that can be used for converting an analog level to a digital representation. The resistive network can include one or more resistive elements coupled between the output terminals of the first stage folding amplifier allowing an interpolation of the output to be provided to the next stage. For example, a resistive network can include several resistive elements having approximately the same value coupled between the outputs. In one embodiment, four resistive elements are coupled between each of the outputs to generate a 4× interpolated output that can be provided to a next stage of folding amplifiers. In this manner, an overall increase in resolution of the input level is achieved while a decrease in errors caused from device mismatch is averaged across the multiple resistor elements. Additionally, through providing a switching network at the input of the first stage folding amplifier and an averaging resistive network at the output of the folding amplifier, an analog input can be chopped and errors due to device mismatch between the folding amplifier and associated circuits can be canceled or reduced. These two effects lead to an increase in resolution and bit conversion rate without having to incorporate complex circuit design or increase device size to reduce errors inherent to ADCs and associated circuits.

Figure 1:
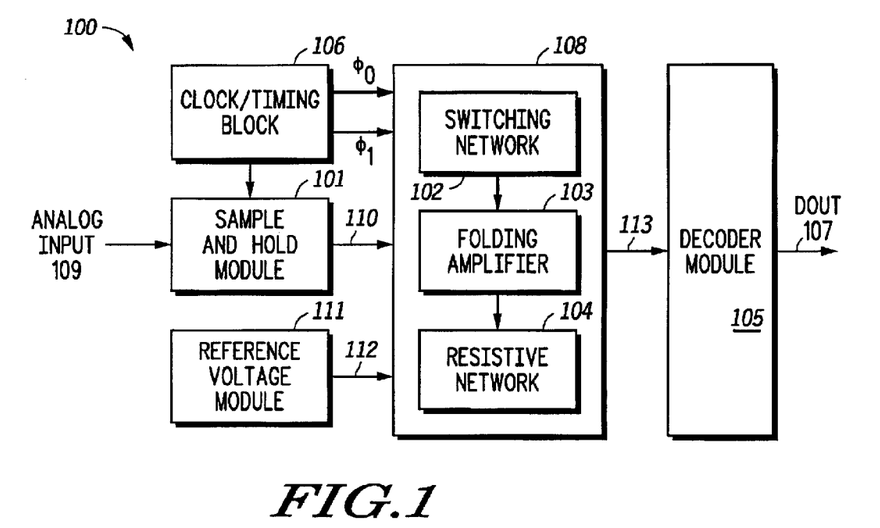
FIG. 1 illustrates a block diagram of an analog-to-digital converter according to one aspect of the invention.

FIG. 1 illustrates a block diagram of an analog-to-digital converter according to one aspect of the invention. ADC 100 includes a sample and hold module 101 coupled to a timing block 106 operable to provide a common clock for timing dependent circuits associated with ADC 100. Folding amplifier module 108 includes a switching network 102 coupled to sample and hold module 101 and reference voltage module 111 and is operable to receive a sampled and held signal 110. Switching network 102 is coupled to folding amplifier 103 and is operable to be switched via $\phi_0$ and $\phi_1$ associated with timing block 106. ADC 100 further includes an averaging resistive network 104 coupled to folding amplifier 103 for providing an averaged output to decoder module 105. Decoder module 105 can include a flash comparator network and decoder (not expressly shown) for outputting a digital representation DOUT 107 of analog input 109.

During operation, sample and hold circuit 101 detects an analog input 109 based on the conversion rate of ADC 100 and a sample rate of sample and hold module 101. For example, a conversion rate of 25 million samples per second can be desired. Upon sample and hold module 101 receiving a "hold" signal from timing block 106, a voltage level from input signal 109 is held by sample and hold module 101 at its output 110 and conversion the voltage at signal 110 is initiated. For example, switching network 102 can be activated in a first state via $\phi_1$ for one half the period of the sample and hold rate and can couple signal 110 to a pair of input terminals associated with folding amplifier 103 further illustrated as folding amplifier 203 of FIG. 2. After a duration of approximately one half the sample and hold rate, a second state $\phi_0$ is provided and switches the polarity of signal 110 and reference voltages 111 at their respective inputs to the folding amplifier 103. For example, sample and hold output 110 coupled to a positive terminal of the differential pair is switched to a negative terminal and the input coupled to the negative terminal is switched to the positive terminal (not expressly shown). In this manner, a 'chopping effect' is realized by folding amplifier 103 thereby substantially reducing offset errors that can be introduced by circuitry associated with folding amplifier 103.

Sample and hold output 110 processed by folding amplifier 103 is output to a decoder module 105 via averaging resistive network 104 and is operable to determine a binary representation of the detected levels and output a digital value (DOUT) 107 based on the determined value. For example, a flash comparator module (not expressly shown) can be provided to determine a value based on several voltage levels provided by averaging resistive network 104. In this manner, the effects of device mismatch can be reduced through providing switching network 102 at the input of folding amplifier 103 and averaging resistive network 104 coupled to the output of folding amplifier 103.

Figure 2:
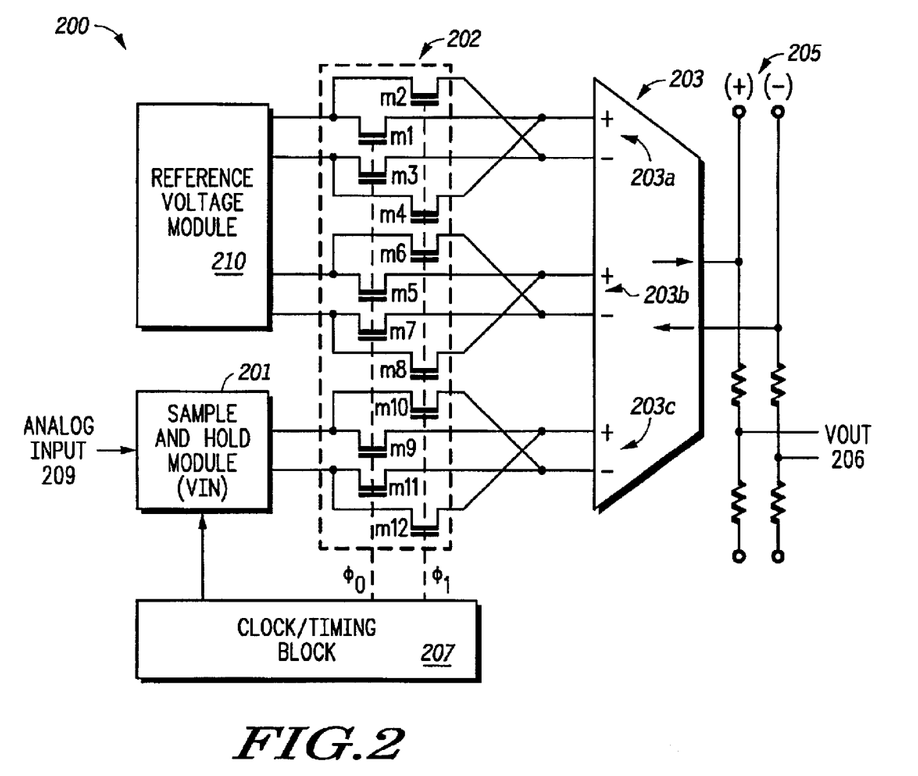
FIG. 2 illustrates a schematic diagram of a switched folding amplifier using averaging resistive network for use within an analog-to-digital converter according to one aspect of the invention.

FIG. 2 illustrates a schematic diagram of a switched folding amplifier including an averaging resistive network for use within an analog-to-digital converter according to one aspect of the invention. Switched folding amplifier 200 is similar to analog to digital converter 100 of FIG. 1 and includes greater detail of a switching network 102 similar, folding amplifier 103 and resistive network 104. Switching folding amplifier 200 includes a three-fold folding amplifier 203 having associated input terminal pairs 203a, 203b and 203c. The terminals are connected to sample and hold module 201 and reference voltage module 210 via switching network 202. Sample and hold module 201 detects an analog input 209 and latches the input level for a time period long enough to allow for a conversion of analog input 209 into a digital representation. Folding amplifier 203 is coupled to resistive network 205 operable to provide an averaged output 206 across several resistive elements. Switched folding amplifier 200 can provide a processed level at output 206 to a subsequent portion of an ADC (not expressly shown) such as a flash comparator, second folding amplifier stage, or other circuit as needed for additional analog-to-digital conversion.

Switching network 202 includes plural transistors configured to allow for passing of a sampled analog level during an appropriate time period. Each transistor pair alternates between cutoff and saturation based on $\phi_0$ and $\phi_1$ and allows a differentiated input level to be directly coupled to the positive (+) and negative (−) input terminals of input terminal pairs 203a, 203b, 203c or to be re-routed or switched to the opposite input terminals (− and +) of input terminal pairs 203a, 203b, 203c.

During operation, sample and hold circuit 201 detects analog voltage 209 and couples an input to switching network 202. Additionally, reference voltage module 210 provides reference voltage levels to folding amplifier 203 via switching network 202. With switching network 202 activated by $\phi_0$, the input is directly coupled to each positive and negative terminal of folding amplifier 203 for a period of approximately one-half the sample rate of sample and hold module 201. For example, during period ($\phi_0$, m1, m3, m5, m7, m9 and m11 are in an active (e.g. saturated) state. At approximately one-half the duration of the sample and hold module 201, $\phi_1$ is provided and m2, m4, m6, m8, m10 and m12 are activated and m1, m3, m5, m7 m9 and m11 are deactivated (e.g. cutoff. As such, $\phi_1$ switches the input between the positive and negative terminals of each differential pair 203a, 203b, and 203c of folding amplifier 203 resulting in a chopping effect of analog input 209.

During each period $\phi_0$ and $\phi_1$, folding amplifier 203 processes the received analog inputs and outputs the amplifier signal to averaging resistive network 204 coupled to folding amplifier 203. Averaging resistive network 204 then averages the output via a resistive network having at least one resistive element thereby providing output VOUT 206 to a next stage for subsequent processing or to a comparator circuit for determining a digital representation of the input voltage level.

Output VOUT 206 of switched folding amplifier 200 can be calculated using the following analysis:

$DOUT(\phi_0)=DOUT(\text{ideal})+DERR(\phi_0)$     Equation 1

$DOUT(\phi_1)=DOUT(\text{ideal})+DERR(\phi_1)$     Equation 2

$DOUT=0.5*(DOUT(\phi_0)+DOUT(\phi_1))$     Equation 3

$DERR(\phi_0)=-DERR(\phi_1)$     Equation 4 if Equation 4 holds true then $DOUT=DOUT(\text{ideal})$     Equation 5

DOUT($\phi_0$) is equal to the digitized output of switched folding amplifier 200 during the $\phi_0$ time period and DOUT ($\phi_1$) is the digitized output of switched folding amplifier 200 during the $\phi_1$ time period, and is combined to provide output DOUT. As such, DOUT is equal to one half the combined voltage levels and given that the input VIN is unchanged between $\phi_0$ and $\phi_1$, the error realized during chopping cancels out due to the level being inverted between the two phases. In this manner, errors due to device mismatch can be cancelled through switching or chopping the input of folding amplifier 205. For example, through providing switching network 202 coupled to input terminal pairs 203a, 203b, 203c of folding amplifier 203 and further providing averaging resistive network 205 at the output of folding amplifier 203, errors due to device mismatch may be reduced through cycling the input between input terminals of folding amplifier 203 and averaging the output of folding amplifier 203 across averaging resistive network 205.

Figure 3:
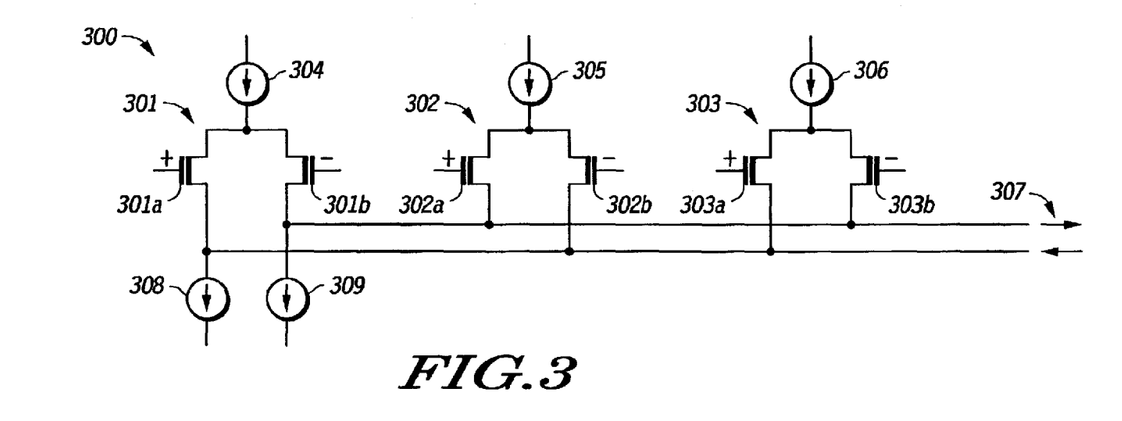
FIG. 3 illustrates a schematic diagram of a folding amplifier according to one aspect of the invention.

FIG. 3 illustrates a schematic diagram of a folding amplifier according to one aspect of the invention. Folding amplifier 300 is a detailed schematic of folding amplifier 203 illustrated in FIG. 2 and includes a first differential pair 301 having input transistors 301a and input transistor 301b, a second differential pair 302 including an associated input transistor 302a and input transistor 302b, and a third differential pair 303 including an associated input transistor 303a and input transistor 303b. Output 307 can be coupled to a resistive network such as resistive network 204 illustrated in FIG. 2 or other electronic circuitry that can aid in facilitating an analog-to-digital conversion. First current source 304 is coupled to first transistor pair 301 and provides a current level based on the state of differential transistor pair 301. Similarly, second current source 305 is coupled to second transistor pair 302 and third current source 306 is coupled to third transistor pair 303.

Folding amplifier 300 is configured as a three-fold folding amplifier and includes each transistor pair that can be operated in a differential mode. This allows a differential input signal to be detected by one of the three transistor pairs and based on which amplifier is activated, the other two transistor pairs are saturated. This results in a differential current that is fed to output 307.

Folding amplifier 300 advantageously compensates for device mismatch through providing a switching network at the input of each differential pair. The switching network switches the input signal between each input terminal of each transistor pair 301, 302, 303. For example, for differential pair 301 the input is switched between 301a and 301b, for differential pair 302 the input is switched between 302a and 302b, and for differential pair 303 the input is switched between 303a and 303b. Through switching the input voltage level a chopping effect is created to reduce error that can occur in the output voltage level.

Figure 4:
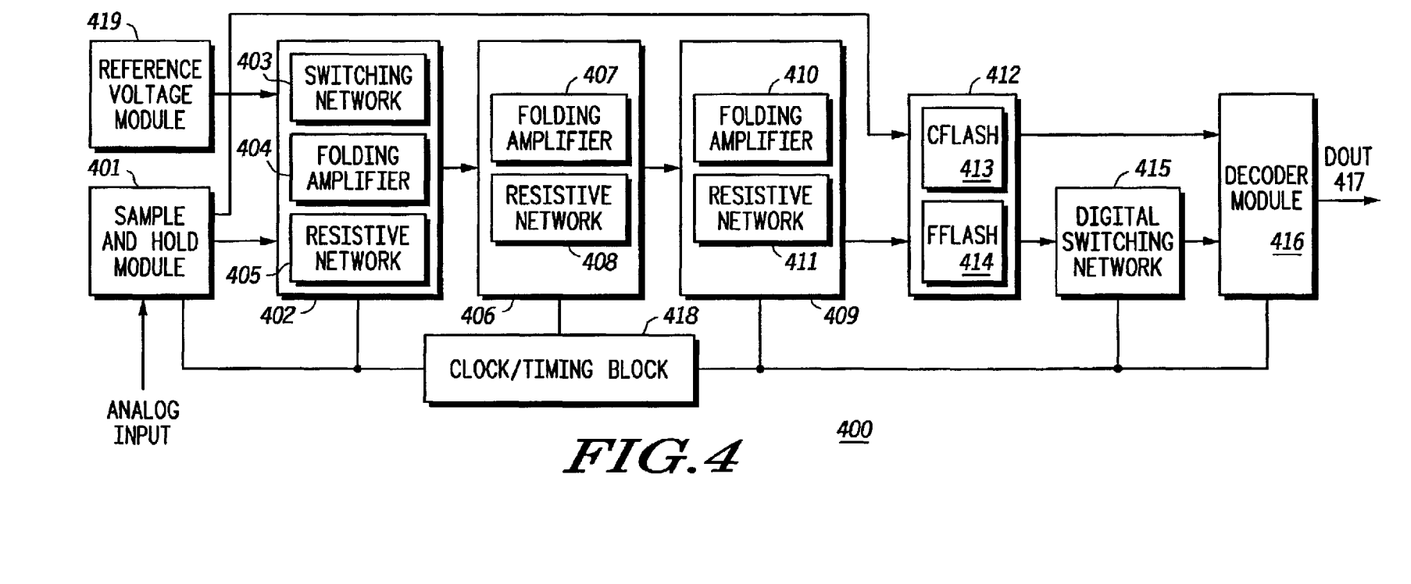
FIG. 4 illustrates a block diagram of a multiple-stage analog-to-digital converter according to one aspect of the invention.

FIG. 4 illustrates a block diagram of a multiple-stage analog-to-digital converter according to one aspect of the invention. Multi-stage ADC 400 includes a sample and hold module 401 and a reference voltage module 419 coupled to a first folding amplifier stage 402 which includes a switching network 403 operable to switch input from sample and hold circuit 401 to appropriate input terminals of folding amplifier 404. Switching network 403 is controlled by timing block 418 and periodically provides folding amplifier 404 an input based on activating switches within switching network 403. Folding amplifier 404 is coupled to averaging resistor network 405 operable to average outputs of folding amplifier 405. First stage 402 is coupled to second folding amplifier stage 406 via averaging resistive network 405 and includes one or more folding amplifiers with one or more input pairs. Second stage 406 includes a second stage averaging resistive network 408 coupled to folding amplifiers 410 of third folding amplifier stage 409 which can include plural folding amplifiers 410 operable to receive an input from averaging resistive network 408. Third folding stage amplifier 409 also includes an averaging resistive network 411 coupled to flash comparator module 412 operable to generate an output based on an output level of averaging resistive network 411. In one embodiment, flash comparator module 412 includes a course flash module 413 coupled to sample and hold module 401 and operable to generate course bits associated with analog input 401 and a fine flash module 414 for generating high resolution bits associated with the converted input and related to the course output bits. A digital switching network 415 is coupled between fine flash comparator module 414 and decoder 416 and is operable as a chopping switch for chopping the output of fine flash comparator module 414. Digital switching circuit 415 is coupled to timing block 418 and is configured in a digital XOR configuration for facilitating the output of fine flash module 414 to decoder 416. Decoder 416 translates the combined course bits and fine bits to a digital representation of the input level and is coupled to output DOUT 417 for outputting the converted analog signal in a digital form.

In one embodiment, multi-stage ADC 400 can be configured as a ten-bit ADC operable to convert an analog level with $2^{10}$ bits of resolution. As such, the output of third stage 409 can be operable to provide 1024 zero crossings to generate ten-bit conversions. Though several combinations of folding amplifiers and resistive networks can be employed to create a ten-bit ADC, one such embodiment operable to provide a ten bit conversion at a 25 million samples per second conversion rate includes first amplifier folding amplifier stage 404 having six folding amplifiers, each folding amplifier including seven input terminal or folds. First folding amplifier 404 being coupled to switching network 403 receives an input level and converts the input level to an output fed to resistive network 405 employing 2× interpolation of the output. Second stage 406 is coupled to resistive network 405 and includes second folding amplifier 407 having four folding amplifiers, each folding amplifier including three fold or input terminals coupled to resistive network 405. Second stage amplifier 406 is coupled to third stage 409 via a resistive network 408 employing 2× interpolation of the output. Third folding amplifier stage 409 includes eight folding amplifiers, each folding amplifier having a fold of one and output to resistive network 411 having a 4× interpolation. The output of third folding amplifier stage 409 is coupled to sixty-four comparators within fine flash module 414 and results in a 10-bit conversion. The output of CFlash 413 is coupled directly to decoder module 416 and combined with the output of fine flash module 414 XOR'ed through digital switching network 415 to generate DOUT 417.

Figure 5:
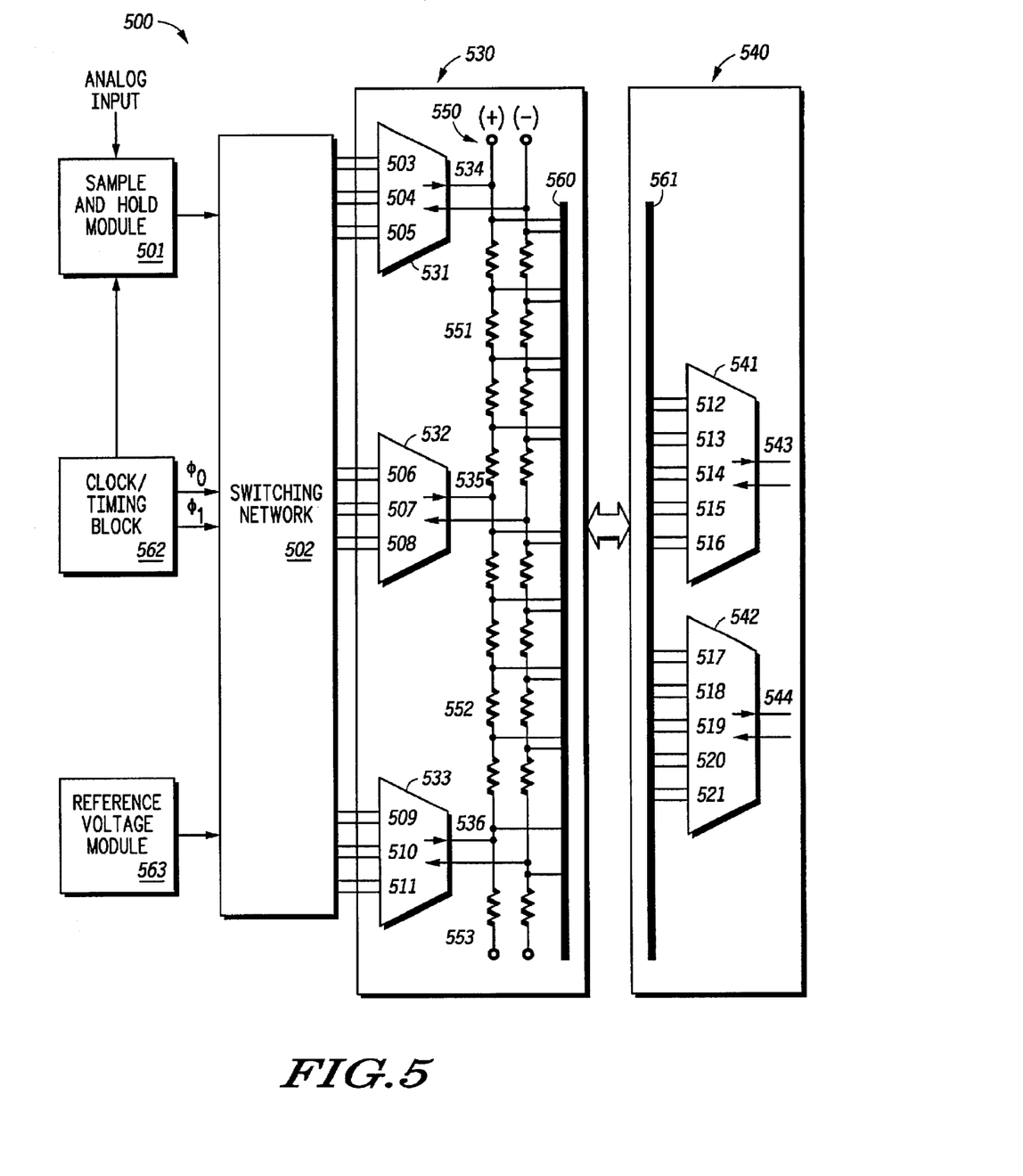
FIG. 5 schematically illustrates one embodiment of interconnecting folding amplifiers within a multi-stage analog-to-digital converter utilizing a switching network and averaging resistive network.

FIG. 5 graphically illustrates one embodiment of interconnecting folding amplifiers within a multi-stage analog-to-digital converter utilizing a switching network and averaging resistive network. Multi-stage ADC 500 schematically illustrates details of two stages of a folding amplifier similar to multi-stage ADC 400 of FIG. 4. Multi-stage ADC 500 includes a sample and hold module 501 and reference voltage module 563 both coupled to switching network 502 operable to detect a voltage level and provide plural inputs to first folding amplifier stage 530.

First folding amplifier stage 530 is configured with three folding amplifiers 531, 532, 533, each folding amplifier having three folds or input pairs coupled to switching network 502. Outputs 534, 535, 536 are coupled to resistive network 550 for generating an input level for second stage amplifier 540. Resistive network 550 includes a first 4× interpolation resistive network 551 operable to provide input to folding amplifier 541 of second folding amplifier 540. Resistive network also includes a second 4× interpolation resistor bank 552 operable to provide input to second folding amplifier stage 540. VOUT 543 and VOUT 544 are fed to a next stage (not expressly shown) for subsequent analog-to-digital conversion processing.

Each folding amplifier 531, 532, 533 within first folding amplifier stage 530 is configured with plural resistive elements and connections such that an interpolation between values 534, 535, 536 provided by each folding amplifier 531, 532, and 533 can be generated. For example, resistor element 551 includes four resistors each having approximately the same value. Each input to folding amplifier 531 can be coupled to contact points within resistive network 550 such an interpolated value created via resistive network 550 may be coupled to first bus 560. First bus 560 is coupled (not expressly shown) to second stage amplifier 540 via second bus 561 operable to provide an input to folding amplifier 541 and folding amplifier 542. First bus 560 and second bus 561 may include several other conductive elements, sources, etc. and control circuits (not expressly shown) that may be used to couple averaging resistive network 550 and folding amplifiers 541 and 542 in various other configurations or methods and as such should not be viewed as the only method of coupling the output of first stage amplifier 530 to second stage amplifier 540. Through providing resistive network 550 having a 4× interpolated output, the overall resolution of the output for first stage 530 can be increased by a factor of four for subsequent analogue-to-digital conversion processing.

During operation, sample and hold module 501 detects an input to be converted from an analog to a digital signal and switching network 502 is activated based on $\phi_0$ and $\phi_1$ provided by clock/timing block 562. For example, switching module 502 can be activated in a first state $\phi_0$ based on a signal that is approximately one-half the value of the sample rate for sample and hold module 501. During ($\phi_0$, each differential amplifier can receive an input directly from sample and hold module 501. During a second state $\phi_1$, switching network 502 switches the analog input between terminal pairs of a duration of approximately one-half the value of the sample rate for sample and hold module 501. Each folding amplifier 531, 532, 533 processes the input during each active phase and outputs the resulting processed level to resistive network 550. Second folding amplifier stage 540 subsequently receives the input via second bus 561 coupled to first bus 560 operably coupled to averaging resistive network 550 having a 4× interpolated output value. Second bus 561 is coupled to first five-fold amplifier 541 having inputs 512, 513, 514, 515, and 516 and to second five-fold amplifier 542 having inputs 517, 518, 519, 520, and 521. Outputs 543 and 544 are then produced via first five-fold amplifier 541 and second five-fold amplifier 542. As such, through alternating $\phi_0$ and $\phi_1$ and averaging the output via resistive network 550 and errors due to device mismatch can be reduced and averaged over resistive network 550.

Figure 6:
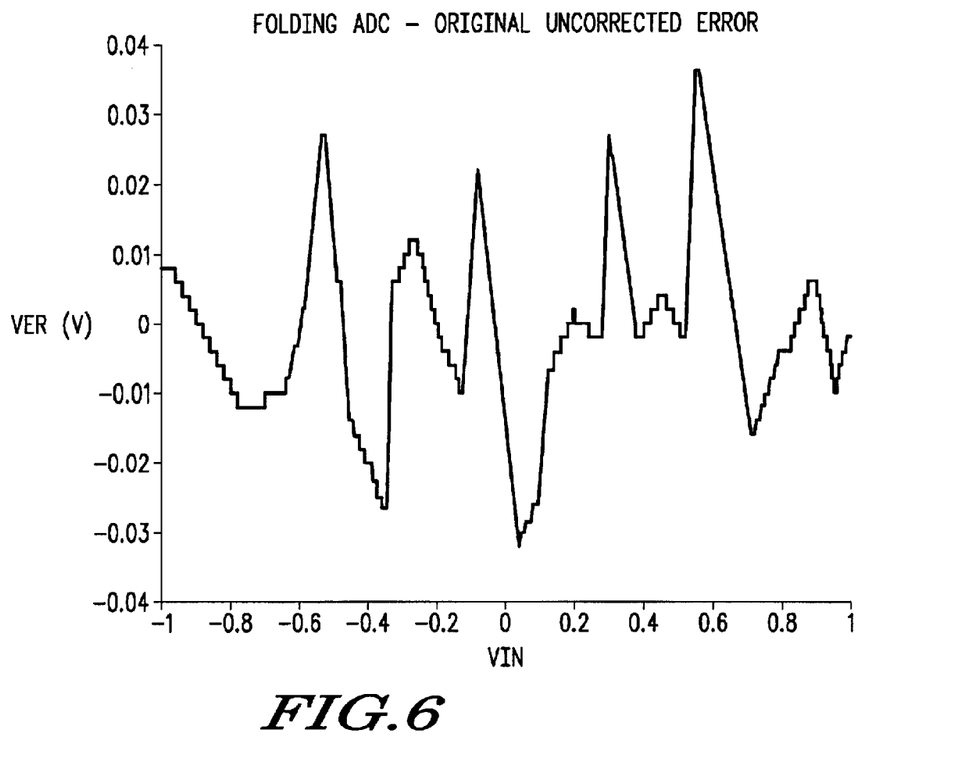
FIG. 6 graphically illustrates the output error of a conventional analog-to-digital converter.

FIG. 6 graphically illustrates the output of a folding analog to digital converter with uncorrected error due to device mismatch. The vertical axis of the graph illustrates the swing in voltage error produced from providing device mismatch within a folding ADC. The input voltage is varied along the horizontal axis with a voltage swing from negative one volt to a positive one volt and the error realized by the folding ADC varies from a −32 millivolts to +36 millivolts. Such an error can lead to as much as a 4-bit loss in resolution in a 10-bit converter.

Figure 7:
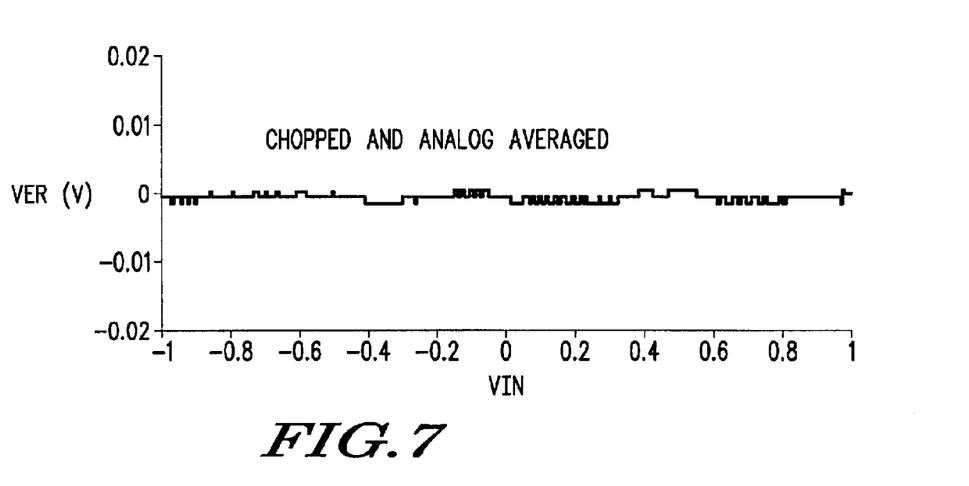
FIG. 7 graphically illustrates the output error of a multiple stage analog-to-digital converter incorporating a switching network and an averaging resistive network.

FIG. 7 graphically illustrates the output of a folding analog to digital converter incorporating a chopping amplifier including analog averaging to correct error due to device mismatch. Similar to the illustration in FIG. 6, error realized by the ADC is illustrated along the vertical axis as the input voltage to the ADC is varied along the horizontal axis from negative one volt to positive one volt. An ADC, similar to ADC 400 of FIG. 4, can be used to produce the results having folding amplifier coupled between a switching network and analog averaging resistors. As the input voltage is varied from a negative one volt to a positive one volt, the switching network associated with the input of the folding amplifier alternates to vary the input between the positive and negative terminals. The output of the folding amplifiers are tied together via an averaging resistive network. Tying each of the amplifiers outputs together via an averaging resistive network decreases the effect of each amplifier independently by a factor of square root (n) for n active amplifiers used within the ADC. The combined use of chopping the input to each folding amplifier and averaging the effects of each amplifier collectively at the output, as illustrated for example by DOUT 107 of FIG. 1, output 206 of FIG. 2, and/or DOUT 417 of FIG. 4 and results in a leveled voltage swing between +/−2 millivolts. As such, resolution for a 10-bit ADC can be realized.

Figure 8:
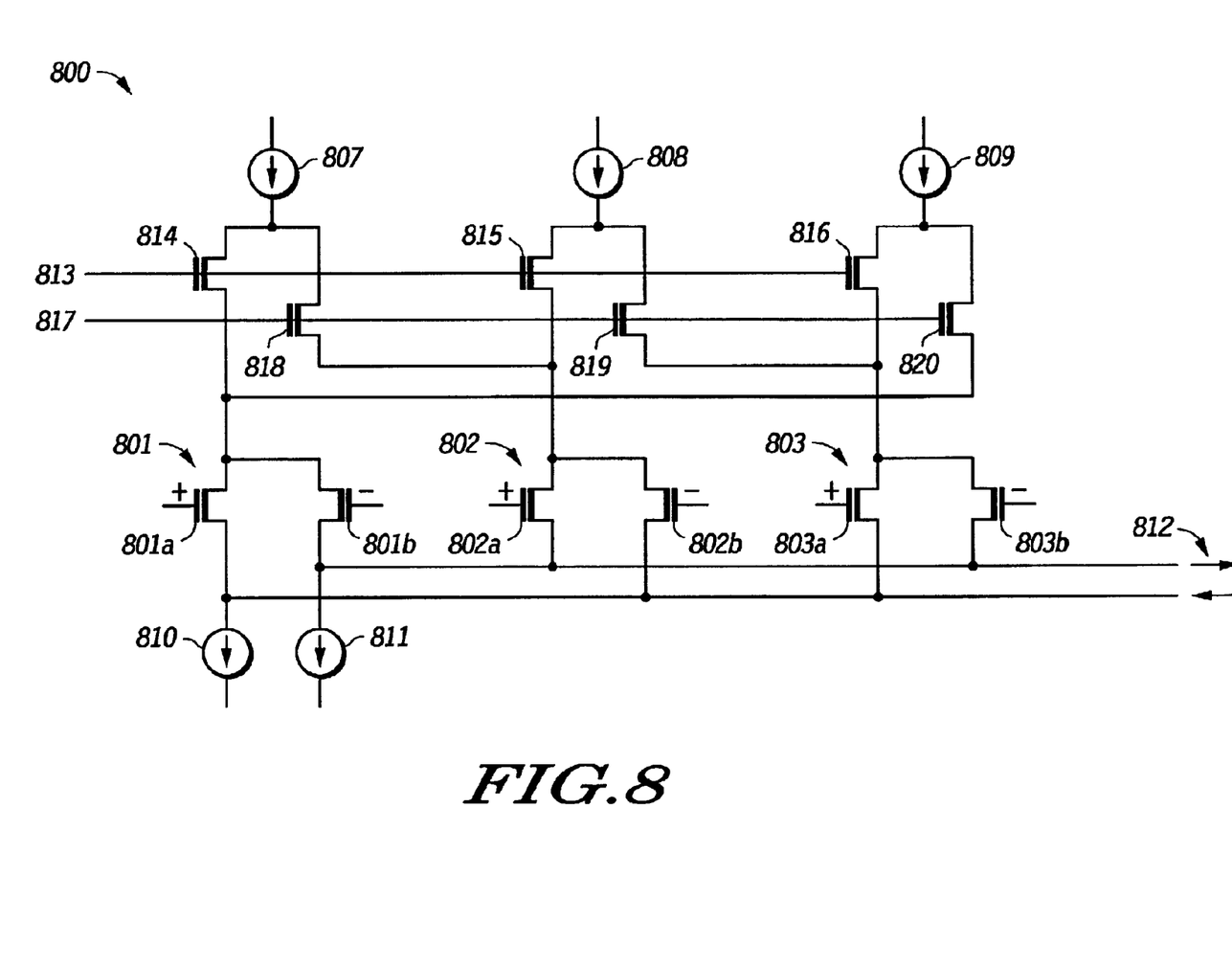
FIG. 8 illustrates a block diagram and schematic of a folding amplifier incorporating a switching network for reducing offsets induced by mismatch in tail currents.

FIG. 8 illustrates a block diagram and schematic of a folding amplifier incorporating a switching network for reducing offsets induced by mismatch in tail currents associated with folding amplifiers. A folding amplifier, illustrated generally at 800 includes a first differential amplifier pair 801 having an associated positive input 801a and negative input 801b, a second differential pair 802 and associated positive input 802a and negative input 802b, and a third differential pair 803 and associated positive input 803a and negative input 803b. Folding amplifier 800 further include a first current source 807 associated with first differential pair 801, a second current source 808 associated with second differential pair 802, and a third current source 809 associated with third differential pair 803. Folding amplifier 800 also includes a switching network having plural transistors operable to provide switching between of each current source 807, 808, and 809. Switching network includes a first switching control node 813 operable to enable and disable first switch 814, second switch 815, and third switch 816. Switching network further includes a second switching control node 817 operable to operable to enable and disable fourth switch 818, fifth switch 819, and sixth switch 820. Folding amplifier 800 includes differential output 812 operable to provide an output signal to a next stage for analog-to-digital processing.

During operation, an input is provided via a sample an hold module (not expressly shown) to folding amplifier 800 via input terminals 801a–b, 802a–b, and 803a–b. Current sources 807, 808, and 809 provide constant current for each differential pair 801, 802, and 803 and depending on the input level, one of the input sources will be in a differential mode while the remaining differential pairs will be saturated. Additionally, each current source 807, 808, 809 is shifted based on the state of switching sources 813 and 817. For example, if first switching source 813 provides a level to activate current switches 814, 815 and 816, then switching source 817 will provide a level operable to deactivate current switches 818, 819, and 820. As such, current provided from current sources 807, 808 and 809 is distributed based on the state of each switch. For example, when 813 is active, current is provided for each respective differential pair 801, 802, 803 for a predetermined period of time. When a specified time period has elapsed, 813 becomes inactive and 814 becomes active. As such, transistor switches 814, 815, and 816 become inactive and transistor switches 818, 819, 820 become active. In this state, current originating from first current source 807 is shifted from first differential pair 801 to 802, and current from second current source 808 is shifted from second differential pair 802 to third differential pair 803, and current from third current source 809 is shifted from third differential pair 803 to first differential pair 801. The current source connections for state 817 are approximately equal to the current source connections for state 813. In this manner, through switching current sources between each of the differential pairs during processing, a chopping effect can be created for the mismatch between the current sources.

The analysis below can be used to describe how errors can be reduced through switching current sources between differential amplifiers. Assume that 802 is active and differential pairs, 801 and 803 are saturated:

$$VOS0=(I807-I809)/gm \qquad \text{Equation 6}$$

$$VOS1=(I809-I808)/gm \qquad \text{Equation 7}$$

VOS0 represents the voltage level as seen by output 812 when 813 is active and VOS1 represent voltage levels as seen at output 812 when 817 is active. For example, when first differential amplifier 801 and third differential amplifier 803 are placed in saturation, current is directly coupled through each transistor pair 801, 802, 803 and results in output 812. As such, voltage offset VOS0 produced by folding amplifier 800 is the difference between each current source divided by the conductance of folding amplifier 800. In a similar manner, as second state 817 becomes active, current is shared between differential amplifier pairs. For example, the current is shared across second differential pair 802 and third differential pair 803 creating VOS1 at output 812. Combining VOS0 and VOS1 results in:

$$VOS=(VOS0+VOS1)/2 \qquad \text{Equation 8}$$

$$VOS=(I807-I808)/(2\,gm) \qquad \text{Equation 9}$$

In this manner, current presented by I809 is cancelled and the remaining current difference (I807–I808) is reduced by two times the conductance of folding amplifier 800 resulting in an overall decrease in voltage offset VOS of folding amplifier 800. In general, the improvement in offset for an amplifier with N folds is $\sqrt{2}\cdot(N-1)$.

Figure 9:
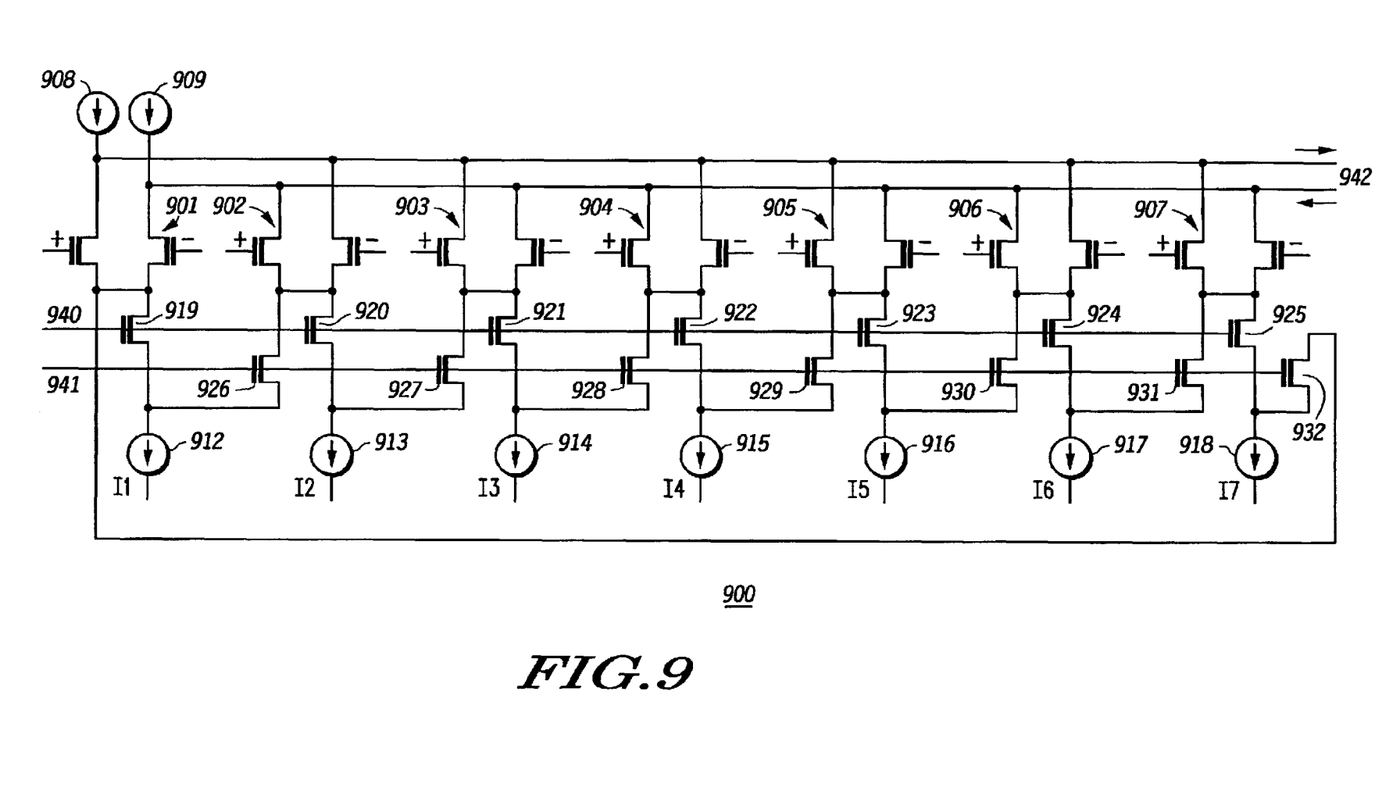
FIG. 9 illustrates a block diagram and schematic of a seven-fold folding amplifier incorporating a switching network for reducing offsets induced by mismatch in tail currents.

FIG. 9 illustrates a block diagram and schematic of a seven-fold folding amplifier 900 incorporating a switching network for reducing offsets induced by mismatch in tail currents. A seven fold folding amplifier 900 includes a first differential input pair 901, second differential input pair 902, third differential input pair 903, fourth differential input pair 904, fifth differential input pair 905, sixth differential input pair 906, and seventh differential input pair 907. Each differential pair includes an associated current source 912, 913, 914, 915, 916, 917, 918. Folding amplifier 900 further includes an output 942 and a first tail current 908 and second tail current 909.

Folding amplifier 900 also includes a switching network coupled to each tail current and each differential pair. A first switching source 940 enables and disables first transistor switch 919, second transistor switch 920, third transistor switch 921, fourth transistor switch 922, fifth transistor switch 923, sixth transistor switch 924, and seventh transistor switch 925. Additionally, second switching source 941 enables and disables eighth transistor switch 926, ninth transistor switch 927, tenth transistor switch 928, eleventh transistor switch 929, twelfth transistor switch 930, thirteenth transistor switch 931, and fourteenth transistor switch 932.

During operation, folding amplifier 900 can be used in association with reducing errors through distributing tail currents produced during operation between differential pairs. As such, a type of chopping effect is produced across folding amplifier 900. For example, when 940 is active (IOP0) and 941 is inactive:

$$IOP0=I1+I3+(0.5)*I4+I6-3.5*I0 \qquad \text{Equation 10}$$

$$ION0=I2+(0.5)*I4+I5+I7-3.5*I0 \qquad \text{Equation 11}$$

Combining each of the equations leads to:

$$IOS0=IOP0-ION0 \qquad \text{Equation 12}$$

$$IOS0=I1-I2+I3-I5+I6-I7 \qquad \text{Equation 13}$$

During the second phase of operation when first switching source 940 is inactive second switching source 941 is active, the resulting current source levels include:

$$IOP1=I7+I2+(0.5)*I3+I5-3.5*I0 \qquad \text{Equation 14}$$

$$ION1=I1+(0.5)*I3+I4+I6-3.5*I0 \qquad \text{Equation 15}$$

Combing the active state equations results in:

$$IOS1=IOP1-ION1 \qquad \text{Equation 16}$$

$$IOS1=-I1+I2-I4+I5-I6+I7 \qquad \text{Equation 17}$$

Combining each of the resulting currents generated during each active state of each source 940, 941 results in:

$$IOSout=(IOS0+IOS1)*(0.5) \qquad \text{Equation 18}$$

or $$IOSout=(I3-I4)*(0.5)=\Delta Imm/2 \qquad \text{Equation 19}$$

Where ΔImm is the mismatch between two current sources. The resulting offset voltage can be described as:

$$VOSout/VOS=1/\square 12 \qquad \text{Equation 20}$$

As such, the ratio of the offset voltage generated during switching or chopping as it relates to the unchopped offset voltage for folding amplifier 900 can be reduced to 1/□12. In this manner, through providing a switching network operable to chop the current sources operation, errors inherent to folding amplifier 900 can be reduced without having to increase the overall device size to reduce offset errors that can be inherent to a specific design for an operating range.

Figure 10:
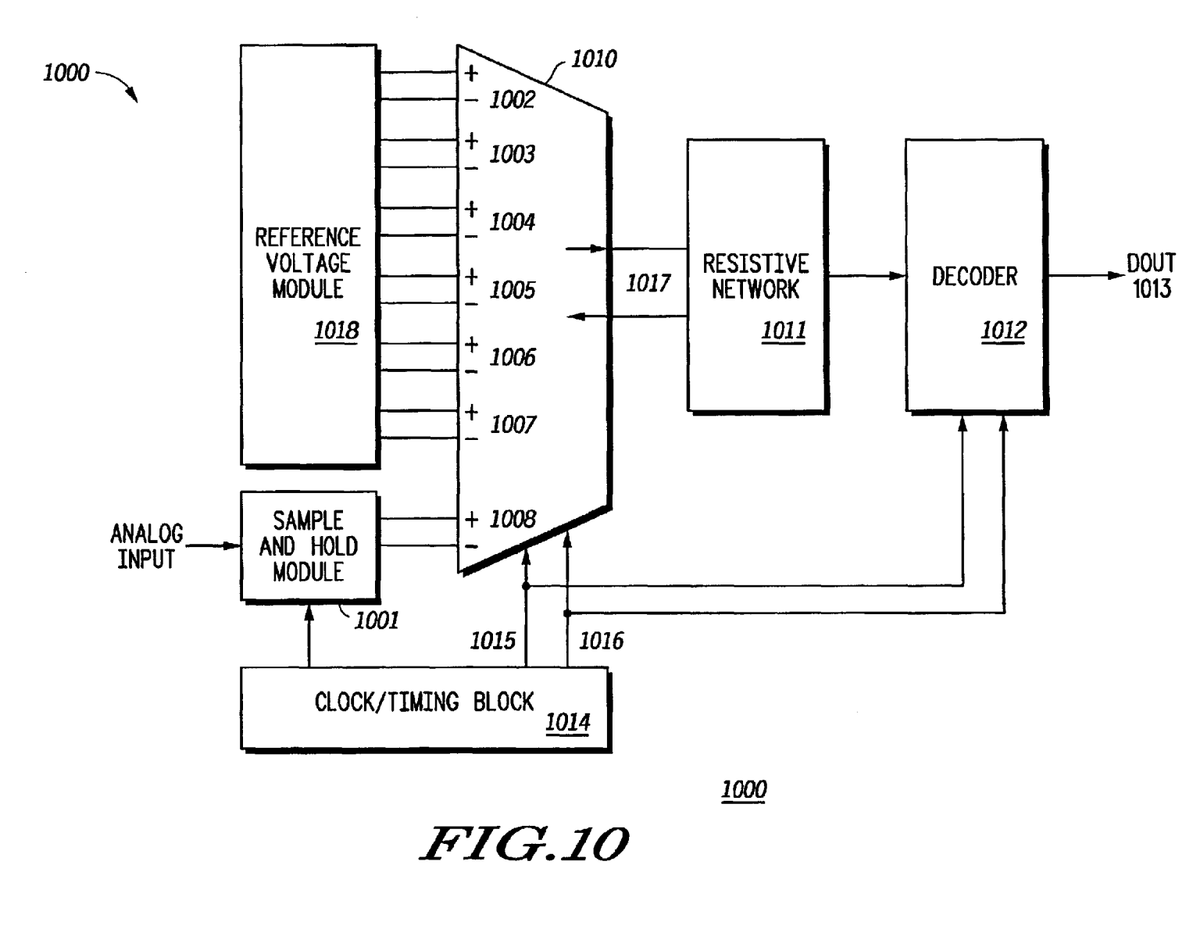
FIG. 10 illustrates an analog to digital converter incorporating a folding amplifier having a switching network for reducing offsets induced by mismatch in tail currents.

FIG. 10 illustrates an analog to digital converter incorporating a folding amplifier having a switching network for reducing offsets induced by mismatch in tail currents. An analog to digital converter 1000 includes seven fold folding amplifier 900 illustrated in FIG. 9 and illustrated as folding amplifier 1010. A sample and hold module 1001 together with a reference voltage module 1018 are coupled to a folding amplifier 1010 and includes seven folds or inputs 1002, 1003, 1004, 1005, 1006, 1007, 1008. Folding amplifier 1010 is coupled to a resistive network 1011 operable to generate an output level for decoder module 1012 that can include a comparator network (not expressly shown) for generating DOUT 1013. Clock/Timing Block 1014 provides timing for sample and hold module 1001 and further provides timing for first switching source 1015 and second switching source 1016.

During use, folding amplifier 1010 receives inputs via sample and hold module 1001 and reference voltage module 1018 and a first switching source 1015 is activated during a first portion of the sample and hold. As such, a series of control switches operably associated with first switching source 1015 are activated and output 1017 is provided based on a non-shared current source environment. During a second point of the sample and hold, first switching source 1015 is inactive and second switching source 1016 is active. This enables each differential pair to share current sources to provide output 1017. Resistive network 1011 provides one or more voltage levels to a comparator module associated with decoder 1012 for generating DOUT 1013. As such, high voltage offsets caused by solely using non-shared current sources for differential pairs can be reduced.

In the preceding detailed description, reference has been made to the accompanying drawings that form a part hereof, and in which are shown by way of illustration specific embodiments in which the invention can be practiced. These embodiments and certain variants thereof, have been described in sufficient detail to enable those skilled in the art to practice the invention. It is to be understood that other suitable embodiments can be utilized and that logical, mechanical, chemical and electrical changes can be made without departing from the spirit or scope of the invention.

For example, the invention has been described with respect to 8-bit and 10-bit ADCs with resolutions as low as 2 millivolts, however, it will be appreciated that n-bit ADCs can be realized using the techniques, devices, and optimization methods described herein. In addition, it will be appreciated that the functional blocks shown in the figures could be further combined or divided in a number of manners without departing from the spirit or scope of the invention. For example, although a folding amplifier architecture is employed by the invention, other architectures such as a flash architecture with an averaging network may employ the techniques disclosed herein. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. An apparatus comprising:
    a folding amplifier comprising N consecutive folding stages, including a first folding stage and a second folding stage, each of the N consecutive folding stages comprise a differential pair operably coupled to a corresponding one of N current sources, where N is greater than or equal to two;
    a switching network coupled between a first current source of the N current sources and the first and second differential pairs, the switching network operable to enable coupling the first current source to one of the first differential pair and the second differential pair.

2. The apparatus of claim 1 further comprising second current source of the N current sources operable to be coupled to one of the first differential pair and the second differential pair via the switching network.

3. The apparatus of claim 2 wherein the switching network is operable to couple the first current source to the first differential pair and the second current source to the second differential pair.

4. The apparatus of claim 3 wherein the switching network is operable to couple the first current source to the second differential pair.

5. The apparatus of claim 1 wherein the switching network further comprise:
    a first source operable to provide, a first state to couple the first current source to the first differential pair; and
    a second source operable to provide a second state to couple the first current source to the second differential pair.

6. The apparatus of claim 1 wherein the switching network comprises:
    a first transistor operable to couple the first current source to the first differential pair; and
    a second transistor operable to couple the first current source to the second differential pair.

7. The apparatus of claim 6 further comprising a third differential pair of a third folding stage operable to be coupled to a third current source of the N current sources via the switching network.

8. The apparatus of claim 7 further comprising a third transistor operable to couple the third current source to the first differential pair during first or second operating state of the switching network.

9. A system for use with an analog-to-digital converter comprising:
    a folding amplifier comprising a plurality of consecutive folding stages each of the plurality of stages comprising a differential pair, the folding amplifier operable to receive an analog input from a sample and hold module and provide an output to an averaging resistive network; and
    a switching network coupled to at least one current source operably associated with the folding amplifier and operable to couple the at least one current source to at least two folding stage differential pairs of the folding amplifier.

10. The system of claim 9 comprising a switching network coupled between the sample and hold module and input terminals of the folding amplifier, the switching network operable to switch the input between the input terminals of the folding amplifier.

11. The system of claim 10 comprising an averaging resistive network coupled to the output of the folding amplifier and operable to provide an averaged output of the folding amplifier.

12. The system of claim 9 further comprising:
a first stage including the folding amplifier and a switching network; and
a second stage coupled to the first stage via an averaging resistive network of the first stage, the second stage including a second stage current source operable to be coupled to a differential pair of the second stag via the switching network.

13. The system of claim 12 further comprising a comparator module coupled to an output resistive network of the second stage amplifier, the comparator module operable to provide an input to a decoder module for outputting a digital representation of the analog input.

14. The system of claim 9 further comprising n folding stages each having a differential pair coupled to n current sources, each current source operable to be switched between at two of the n differential pairs, where n is an integer.

15. A folding amplifier for use in association with converting an analog voltage to a digital output comprising:
a first folding stage comprising a first differential pair operable to be coupled to a first current source and a third current source;
a second folding state comprising a second differential pair operable to be coupled to a second current source and the first current source;
a third folding stage comprising a third differential pair operable to coupled to the second current source and the third current source; and
a switching network including
a first state operable to couple the first current source to the first differential pair, the second current source to the second differential pair, and the third current source to the third differential pair; and
a second state operable to couple the first current source to the second differential pair, the second current source to the third differential pair, and the third current source to the first differential pair.

16. A method for processing an analog input using a folding amplifier comprising:
providing a first state operable to couple a first current source to a common current electrode of a first differential pair of a first folding stage; and
providing a second state operable to couple a second current source to the common current electrode of the first differential pair.

17. The method of claim 16 further comprising coupling the first current source and the current source coupled to the first differential pair via a switching network.

18. The method of claim 16 further comprising coupling an input to the first differential pair via a second switching network operably coupled between a sample and hold module and the first and second differential pairs.

19. The method of claim 16 further comprising providing an output of the first differential pair via an averaging resistive network coupled to a comparator module.

20. The method of claim 19 further comprising decoding the output of the comparator module to provide a digital representation of the analog input.

21. The method of claim 16 further comprising:
enabling a first transistor during the first state to couple the first current source to the first differential pair;
enabling a second transistor during the first state to couple the second current source to the first differential pair; and
enabling a third transistor during the first state to couple a third current source to a second differential pair of a second folding stage.

22. The method of claim 21 further comprising:
enabling a fourth transistor during the second state to couple the first current source to the second transistor pair;
enabling a fifth transistor during the second state to couple the second current source to the third differential pair; and
enabling a sixth transistor during the second state to couple the third current source to the first differential pair.

* * * * *

UNITED STATES PATENT AND TRADEMARK OFFICE
CERTIFICATE OF CORRECTION

PATENT NO. : 6,825,716 B2
DATED : November 30, 2004
INVENTOR(S) : Michael J. McGowan It is certified that error appears in the above-identified patent and that said Letters Patent is hereby corrected as shown below:

Column 12,
Line 25, add -- a -- between the words "comprising" and "second"
Line 37, add -- s -- after the word "comprise"

Column 13,
Line 36, replace the word "state" with -- stage --
Line 41, add -- be -- between the words "to" and "coupled"

Column 14,
Line 14, add -- second -- between the words "the" and "current"

Signed and Sealed this

Fifth Day of April, 2005

JON W. DUDAS
*Director of the United States Patent and Trademark Office*